United States Patent
Kim et al.

(10) Patent No.: US 10,636,580 B2
(45) Date of Patent: Apr. 28, 2020

(54) ORGANIC-INORGANIC HYBRID SOLAR CELL

(71) Applicant: LG Chem, Ltd., Seoul (KR)

(72) Inventors: Seiyong Kim, Daejeon (KR); Sang Jun Park, Daejeon (KR); Jong Seok Kim, Daejeon (KR); Jaein Lee, Daejeon (KR); Yongnam Kim, Daejeon (KR); Sang Kwon Lee, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 15/745,557

(22) PCT Filed: Jul. 10, 2017

(86) PCT No.: PCT/KR2017/007353
§ 371 (c)(1),
(2) Date: Jan. 17, 2018

(87) PCT Pub. No.: WO2018/012825
PCT Pub. Date: Jan. 18, 2018

(65) Prior Publication Data
US 2018/0211791 A1  Jul. 26, 2018

(30) Foreign Application Priority Data
Jul. 14, 2016 (KR) .................. 10-2016-0089317

(51) Int. Cl.
*H01G 9/20* (2006.01)
*H01L 51/42* (2006.01)
*H01L 51/44* (2006.01)
*H01L 51/00* (2006.01)

(52) U.S. Cl.
CPC ....... *H01G 9/2018* (2013.01); *H01L 51/4213* (2013.01); *H01L 51/4246* (2013.01); *H01L 51/442* (2013.01); *H01L 51/006* (2013.01); *H01L 51/0056* (2013.01); *H01L 51/0067* (2013.01); *H01L 51/0077* (2013.01); *Y02E 10/549* (2013.01)

(58) Field of Classification Search
CPC .............. H01G 9/2018; H01L 51/4213; H01L 51/2426
See application file for complete search history.

(56) References Cited

U.S. PATENT DOCUMENTS

| | | |
|---|---|---|
| 2015/0340632 A1 | 11/2015 | Etgar |
| 2016/0005547 A1 | 1/2016 | Seok et al. |
| 2016/0049585 A1 | 2/2016 | Lin et al. |

(Continued)

FOREIGN PATENT DOCUMENTS

| | | |
|---|---|---|
| CN | 104518091 A | 4/2015 |
| CN | 105576127 A | 5/2016 |

(Continued)

OTHER PUBLICATIONS

Extended European Search Report for Application No. EP17818024.6 dated Sep. 11, 2018.

(Continued)

*Primary Examiner* — Shannon M Gardner
(74) *Attorney, Agent, or Firm* — Lerner, David, Littenberg, Krumholz & Mentlik, LLP (57) ABSTRACT

The present specification relates to an organic-inorganic hybrid solar cell.

12 Claims, 3 Drawing Sheets

(56) References Cited

U.S. PATENT DOCUMENTS

| | | | |
|---|---|---|---|
| 2017/0125171 A1 | 5/2017 | Lee et al. | |
| 2017/0186559 A1* | 6/2017 | Zhu | H01L 51/4226 |
| 2017/0213651 A1* | 7/2017 | Wang | H01L 51/0032 |
| 2018/0174761 A1* | 6/2018 | Kamino | H01L 51/4226 |

FOREIGN PATENT DOCUMENTS

| | | |
|---|---|---|
| EP | 292826 A2 | 11/1988 |
| EP | 3136450 A1 | 3/2017 |
| KR | 20140091488 A | 7/2014 |
| KR | 20150122598 A | 11/2015 |
| KR | 20150124413 A | 11/2015 |
| KR | 101578875 B1 | 12/2015 |
| KR | 20150135202 A | 12/2015 |
| KR | 20150143010 A | 12/2015 |
| KR | 20160004389 A | 1/2016 |
| WO | 2014180780 A1 | 11/2014 |
| WO | 2015016201 A1 | 2/2015 |

OTHER PUBLICATIONS

Search report from International Application No. PCT/KR2017/007353, dated Oct. 18, 2017.

Chinese Search report for Application No. 201780002434.7 dated Oct. 11, 2019.

\* cited by examiner

EXAMPLE 1

EXAMPLE 2

COMPARATIVE EXAMPLE 1

COMPARATIVE EXAMPLE 2

ORGANIC-INORGANIC HYBRID SOLAR CELL

CROSS-REFERENCE TO RELATED APPLICATIONS

The present application is a national phase entry under 35 U.S.C. § 371 of International Application No. PCT/KR2017/007353 filed Jul. 10, 2017, which claims priority from Korean Patent Application No. 10-2016-0089317 filed Jul. 14, 2016, all of which are incorporated herein by reference.

TECHNICAL FIELD

The present specification relates to an organic-inorganic hybrid solar cell.

BACKGROUND ART

In order to solve the global environmental problems caused by the depletion of fossil fuels and the use thereof, studies have been actively conducted on alternative energy sources, which may be regenerated and are clean, such as solar energy, wind power, and water power. Among them, interests in solar cells which change electric energy directly from the sunlight have been greatly increased. Here, the solar cell means a cell which produces current-voltage by using a photovoltaic effect of absorbing photoenergy from the sunlight to generate electrons and holes.

Organic-inorganic hybrid perovskite materials have recently drawn attention as a light absorbing material for organic-inorganic hybrid solar cells due to the characteristics in which the absorption coefficient is high and the material can be easily synthesized through a solution process.

In general, an absorbing layer used in an organic-inorganic hybrid solar cell is composed of a single cation, a metal ion, and a halogen ion as a basic structure which uses an $AMX_3$ component, but in this case, there are problems with low efficiency and stability caused by vulnerability to moisture, and the like.

In particular, a perovskite formed of a single cation and representatively used has problems in that the stability deteriorates and the properties are changed due to lattice spacing according to a phase transition at a driving temperature or a temperature equal to or less than the driving temperature. The perovskite easily undergoes a phase transition even in a driving or typical storage state, and thus is converted into other crystals rather than perovskite, so that there is a problem in that characteristics of an inherent solar cell deteriorate or are lost.

DETAILED DESCRIPTION OF THE INVENTION

Technical Problem

The present specification provides an organic-inorganic hybrid solar cell having excellent stability and energy conversion efficiency.

Technical Solution

An exemplary embodiment of the present specification provides an organic-inorganic hybrid solar cell including:

(a) a first electrode;
(b) an electron transporting layer or a hole transporting layer which is provided on the first electrode;
(c) a first light absorbing layer which includes a compound having a perovskite structure and is provided on (b) the electron transporting layer or the hole transporting layer;
(d) a second light absorbing layer which includes a compound having a perovskite structure and is provided on the first light absorbing layer;
(e) a third light absorbing layer which includes a compound having a perovskite structure and is provided on the second light absorbing layer;
(f) a hole transporting layer or an electron transporting layer which is provided on the third light absorbing layer; and
(g) a second electrode which is provided on (f) the hole transporting layer or the electron transporting layer,
wherein the first light absorbing layer and the second light absorbing layer have different phase transition temperatures, and
the second light absorbing layer and the third light absorbing layer have different phase transition temperatures.

Advantageous Effects

An organic-inorganic hybrid solar cell according to an exemplary embodiment of the present specification has an effect in that a crystal structure of a base layer serves as a binder of crystals of an upper layer to suppress a lattice spacing phenomenon caused by a change in temperature, and as a result, the stability of a device is enhanced.

Further, the organic-inorganic hybrid solar cell according to an exemplary embodiment of the present specification has an effect in that interfacial characteristics are improved, and as a result, current density and energy conversion efficiency are enhanced.

In addition, the organic-inorganic hybrid solar cell according to an exemplary embodiment of the present specification can absorb a broad light spectrum, and thus has an effect in that light energy absorption is increased, and as a result, energy conversion efficiency is enhanced.

101: Substrate
102: First electrode
103: Electron transporting layer
104: First light absorbing layer
105: Second light absorbing layer
106: Third light absorbing layer
107: Hole transporting layer
108: Second electrode

BEST MODE

Hereinafter, the present specification will be described in detail.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

An organic-inorganic hybrid solar cell according to an exemplary embodiment of the present specification includes:

(a) a first electrode;

(b) an electron transporting layer or a hole transporting layer which is provided on the first electrode;

(c) a first light absorbing layer which includes a compound having a perovskite structure and is provided on (b) the electron transporting layer or the hole transporting layer;

(d) a second light absorbing layer which includes a compound having a perovskite structure and is provided on the first light absorbing layer;

(e) a third light absorbing layer which is a compound having a perovskite structure and is provided on the second light absorbing layer;

(f) a hole transporting layer or an electron transporting layer which is provided on the third light absorbing layer; and (g) a second electrode which is provided on (f) the hole transporting layer or the electron transporting layer, in which the first light absorbing layer and the second light absorbing layer have different phase transition temperatures, and the second light absorbing layer and the third light absorbing layer have different phase transition temperatures.

In the present specification, (b) the electron transporting layer or the hole transporting layer and (f) the electron transporting layer or the electron transporting layer are not the same layer, and for example, when (b) is an electron transporting layer, (f) is a hole transporting layer, and when (b) is a hole transporting layer, (f) is an electron transporting layer.

In an exemplary embodiment of the present specification, the first light absorbing layer includes a compound having a perovskite structure represented by the following Chemical Formula 1.

$$AMX_3 \quad \text{[Chemical Formula 1]}$$

In Chemical Formula 1,

A is a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PF_3^+$, $CH_3AsH_3^+$, $CH_3SbH_3^+$, $PH_4^+$, $AsH_4^+$, and $SbH_4^+$, M is a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X is a halogen ion, and n is an integer from 1 to 9.

In an exemplary embodiment of the present specification, the second light absorbing layer includes a compound having a perovskite structure represented by the following Chemical Formula 2 or 3.

$$RM'X'_3 \quad \text{[Chemical Formula 2]}$$

$$R'_yR''_{(1-y)}M'X'_zX''_{(3-z)} \quad \text{[Chemical Formula 3]}$$

In Chemical Formula 2 or 3,

R' and R" are different from each other, and R, R', and R" are each a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, M' is a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, M' and X" are the same as or different from each other, and are each independently a halogen ion, n is an integer from 1 to 9, 0<y<1, and 0<z<3.

In an exemplary embodiment of the present specification, the third light absorbing layer includes a compound having a perovskite structure represented by the following Chemical Formula 4.

$$EM''X'''_3 \quad \text{[Chemical Formula 4]}$$

In Chemical Formula 4,

E is a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, M" is a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X''' is a halogen ion, and n is an integer from 1 to 9.

In an exemplary embodiment of the present specification, the first light absorbing layer has a phase transition temperature of 40° C. or more. Specifically, the first light absorbing layer may have a phase transition temperature of 40° C. to 80° C.

In an exemplary embodiment of the present specification, when R, R', and R" in Chemical Formula 2 or 3 each form a single cation perovskite structure, the phase transition temperature may be −40° C. to 40° C. Specifically, when R, R', and R" in Chemical Formula 2 or 3 each form a single cation perovskite structure, the phase transition temperature may be 0° C. to 40° C. More specifically, when R, R', and R" in Chemical Formula 2 or 3 each form a single cation perovskite structure, the phase transition temperature may be 20° C. to 40° C.

In the present specification, when R, R', and R" in Chemical Formula 2 or 3 each form a single cation perovskite structure, a second light absorbing layer including that R, R', and R" in Chemical Formula 2 or 3 each form a single cation perovskite structure may have a phase transition temperature of −40° C. to 40° C.

In the present specification, the fact that R, R', and R" in Chemical Formula 2 or 3 each form a single cation perovskite structure means that a perovskite having a structure of RM'X'_3, R'M'X'_3, or R"M'X'_3 is formed.

For example, when the second light absorbing layer includes a perovskite having a structure of R'M'X'_3, the second light absorbing layer may have a phase transition temperature of −40° C. to 40° C.

Specifically, the second light absorbing layer may have a phase transition temperature of −40° C. to 40° C.

In an exemplary embodiment of the present specification, the third light absorbing layer has a phase transition temperature of 40° C. or more. Specifically, the third light absorbing layer may have a phase transition temperature of 40° C. to 80° C.

In an exemplary embodiment of the present specification, the phase transition temperature of the first light absorbing layer is higher than the phase transition temperature of the second light absorbing layer. Specifically, when the second light absorbing layer includes a compound having a perovskite structure represented by Chemical Formula 2, the phase transition temperature of the first light absorbing layer may higher than the phase transition temperature of the second light absorbing layer by be 10° C. or more. More specifically, the phase transition temperature of the first light absorbing layer may be higher than the phase transition temperature of the second light absorbing layer by 20° C. or more. More specifically, the phase transition temperature of the first light absorbing layer may be higher than the phase transition temperature of the second light absorbing layer by 20° C. to 50° C.

In an exemplary embodiment of the present specification, when the second light absorbing layer includes a compound having a perovskite structure represented by Chemical Formula 3, the phase transition temperature of the first light absorbing layer may be higher than the phase transition temperature of a case where R' and R" each form a single cation perovskite structure by 10° C. or more. More specifically, the phase transition temperature of the first light absorbing layer may be higher than the phase transition temperature of a case where R' and R" each form a single cation perovskite structure by 20° C. or more. More specifically, the phase transition temperature of the first light absorbing layer may be higher than the phase transition temperature of a case where R' and R" each form a single cation perovskite structure by 20° C. to 50° C.

In the present specification, when R' and R" in Chemical Formula 3 each form a single cation perovskite structure, the phase transition temperature of the first light absorbing layer may be higher than the phase transition temperature of the second light absorbing layer including that R' and R" in Chemical Formula 3 each form a single cation perovskite structure by 10° C. or more.

In the present specification, when the second light absorbing layer includes a compound having a perovskite structure represented by Chemical Formula 3, the phase transition temperature of the first light absorbing layer may be higher than the phase transition temperature of the second light absorbing layer by 10° C. or more.

In an exemplary embodiment of the present specification, the phase transition temperature of the third light absorbing layer is higher than the phase the transition temperature of the second light absorbing layer. Specifically, when the second light absorbing layer includes a compound having a perovskite structure represented by Chemical Formula 2, the phase transition temperature of the third light absorbing layer may be higher than the phase transition temperature of the second light absorbing layer by 10° C. or more. More specifically, the phase transition temperature of the third light absorbing layer may be higher than the phase transition temperature of the second light absorbing layer by 20° C. or more. More specifically, the phase transition temperature of the third light absorbing layer may be higher than the phase transition temperature of the second light absorbing layer by 20° C. to 50° C.

In an exemplary embodiment of the present specification, when the second light absorbing layer includes a compound having a perovskite structure represented by Chemical Formula 3, the phase transition temperature of the third light absorbing layer may be higher than the phase transition temperature of a case where R' and R" each form a single cation perovskite structure by 10° C. or more. More specifically, the phase transition temperature of the third light absorbing layer may be higher than the phase transition temperature of a case where R' and R" each form a single cation perovskite structure by 20° C. or more. More specifically, the phase transition temperature of the third light absorbing layer may be higher than the phase transition temperature of a case where R' and R" each form a single cation perovskite structure by 20° C. to 50° C.

In the present specification, when R' and R" in Chemical Formula 3 each form a single cation perovskite structure, the phase transition temperature of the third light absorbing layer may be higher than the phase transition temperature of the second light absorbing layer including that R' and R" in Chemical Formula 3 each form a single cation perovskite structure by 10° C. or more.

In the present specification, when the second light absorbing layer includes a compound having a perovskite structure represented by Chemical Formula 3, the phase transition temperature of the first light absorbing layer may be higher than the phase transition temperature of the second light absorbing layer by 10° C. or more.

In the present specification, the compound having the perovskite structure in the first light absorbing layer includes a single cation. In the present specification, the single cation means that one kind of cation is used. That is, A in Chemical Formula 1 means that only one kind of monovalent cation is selected. For example, in Chemical Formula 1, A may be $C_nH_{2n+1}NH_3^+$, and n may be an integer from 1 to 9.

In the present specification, the compound having the perovskite structure in the second light absorbing layer may include a single cation. For example, R in Chemical 2 in the present specification may be $HC(NH_2)_2^+$.

In the present specification, the compound having the perovskite structure in the second light absorbing layer may include a complex cation. In the present specification, the complex cation means that two or more kinds of cations are used. That is, in Chemical Formula 3, R' and R" each mean that different monovalent cations are selected. For example, in Chemical Formula 3, R' may be $C_nH_{2n+1}NH_3^+$, R" may be $HC(NH_2)_2^+$, and n may be an integer from 1 to 9.

In the present specification, M, M', and M" may be $Pb^{2+}$.

In the present specification, all of the first light absorbing layer, the second light absorbing layer, and the third light absorbing layer may include a single cation perovskite structure.

In the present specification, the first light absorbing layer may include a single cation perovskite structure, the second light absorbing layer may include a complex cation perovskite structure, and the third light absorbing layer may include a single cation perovskite structure.

In an exemplary embodiment of the present specification, the first light absorbing layer may be $C_nH_{2n+1}NH_3PbI_3$, the second light absorbing layer may be $HC(NH_2)_2PbI_3$, the third light absorbing layer may be $C_nH_{2n+1}NH_3PbI_3$, and n may be an integer from 1 to 9. Specifically, the first light absorbing layer may be $CH_3NH_3PbI_3$ (methylammonium lead iodide, MAPbI$_3$), the second light absorbing layer may be $HC(NH_2)_2PbI_3$ (formamidinium lead iodide, FAPbI$_3$), and the third light absorbing layer may be $CH_3NH_3PbI_3$.

In an exemplary embodiment of the present specification, the first light absorbing layer may be $C_nH_{2n+1}NH_3PbI_3$, the second light absorbing layer may be $(C_nH_{2n+1}NH_3)_y(HC(NH_2)_2)_{(1-y)}PbI_3$, the third light absorbing layer may be $C_nH_{2n+1}NH_3PbI_3$, n may be an integer from 1 to 9, and 0<y<1. Specifically, the first light absorbing layer may be $CH_3NH_3PbI_3$, the second light absorbing layer may be $(C_nH_{2n+1}NH_3)_y(HC(NH_2)_2)_{(1-y)}PbI_3$, the third light absorbing layer may be $CH_3NH_3PbI_3$, n may be an integer from 1 to 9, and 0<y<1. More specifically, the first light absorbing layer may be $CH_3NH_3PbI_3$, the second light absorbing layer may be $(CH_3NH_3)_{0.3}(HC(NH_2)_2)_{0.7}PbI_3$, and the third light absorbing layer may be $CH_3NH_3PbI_3$.

In general, a light absorbing layer composed of a single layer has problems in that the stability deteriorates and properties are changed due to lattice spacing according to a phase transition strongly depending on a temperature. The present specification has an effect in that while the light absorbing layer is a light absorbing layer having a three-layer structure, the phase transition temperatures of the first light absorbing layer and the second light absorbing layer are different from each other, the phase transition temperatures of the second light absorbing layer and the third light absorbing layer are different from each other, and as a result, the lattice spacing caused by a phase transition does not occur. Accordingly, the structural stability may be secured.

In the present specification, the light absorbing layer is formed as a triple layer by using $CH_3NH_3PbI_3$ as a first light absorbing layer, $HC(NH_2)_2PbI_3$ or $(CH_3NH_3)_y(HC(NH_2)_2)_{(1-y)}PbI_3$ as a second light absorbing layer, and $CH_3NH_3PbI_3$ as a third light absorbing layer, thereby increasing the absorbance in a region of about 770 nm to about 810 nm as compared to a case where only a single $MAPbI_3$ layer is used as the light absorbing layer, and accordingly, it is possible to exhibit an effect in that the short-circuit current is increased by increasing the absorption of photoenergy, and the energy conversion efficiency is enhanced. Further, the open-circuit voltage and the charge extraction capability are improved by reducing the difference in energy level between the $HC(NH_2)_2PbI_3$ layer and the charge transporting layer as compared to a case where only a single $HC(NH_2)_2PbI_3$ layer is used as the light absorbing layer, so that there is an effect in that the energy conversion efficiency and stability of an organic-inorganic hybrid solar cell are improved. Further, for current-voltage abnormal characteristics caused by $HC(NH_2)_2PbI_3$ surface defects (vacancy) resulting from a heat treatment process, the third light absorbing layer fills the surface defects (vacancy), so that there is an effect in that interfacial bonding characteristics with an adjacent charge transporting layer to be formed later are improved.

In the present specification, the charge transporting layer means an electron transporting layer or a hole transporting layer.

In the present specification, the phase transition temperature means a temperature at which the arrangement of internal constituent atoms or ions is changed from a crystal phase to another crystal phase. For example, the phase transition temperature of $CH_3NH_3PbI_3$ may mean a temperature at which $CH_3NH_3PbI_3$ changes from a cubic structure to a tetragonal structure. In this case, the phase transition temperature of $CH_3NH_3PbI_3$ is about 54° C. As another example, a temperature at which $HC(NH_2)_2PbI_3$ changes from a trigonal structure to a hexagonal structure may be defined as the phase transition temperature. In this case, the phase transition temperature of $HC(NH_2)_2PbI_3$ is about 20° C.

In an exemplary embodiment of the present specification, the first light absorbing layer has a thickness of 1 nm to 100 nm. In this case, there is an effect in that the first light absorbing layer adjusts an energy level with the common layer and acts as a base layer of the second light absorbing layer.

In the present specification, the common layer means an electron transporting layer or a hole transporting layer.

In the present specification, the thickness of the first light absorbing layer means a width between the surface on which the first light absorbing layer is brought into contact with (b) the electron transporting layer or the hole transporting layer and the surface on which the first light absorbing layer is brought into contact with the second light absorbing layer.

In an exemplary embodiment of the present specification, the second light absorbing layer has a thickness of 1 nm to 600 nm. In this case, there is an effect in that the second light absorbing layer acts as a main light absorbing layer and reduces surface defects of the first light absorbing layer.

In the present specification, the thickness of the second light absorbing layer means a width between the surface on which the second light absorbing layer is brought into contact with the first light absorbing layer and the surface on which the second light absorbing layer is brought into contact with the third light absorbing layer.

In an exemplary embodiment of the present specification, the third light absorbing layer has a thickness of 1 nm to 100 nm. In this case, there is an effect in that the third light absorbing layer improves interfacial characteristics with the electron transporting layer by reducing surface defects of the second light absorbing layer.

In the present specification, the thickness of the third light absorbing layer means a width between the surface on which the third light absorbing layer is brought into contact with the second light absorbing layer and the surface on which the third light absorbing layer is brought into contact with (f) the hole transporting layer or the electron transporting layer.

In the present specification, the light absorbing layer may be formed by a method such as spin coating, slit coating, dip coating, inkjet printing, gravure printing, spray coating, doctor blade, bar coating, brush painting, and thermal deposition.

In the present specification, a light absorbing layer may mean at least one or all of a first light absorbing layer, a second light absorbing layer, and a third light absorbing layer.

In the present specification, the organic-inorganic hybrid solar cell may further include a substrate. Specifically, the substrate may be provided at a lower portion of the first electrode.

Figure 1:
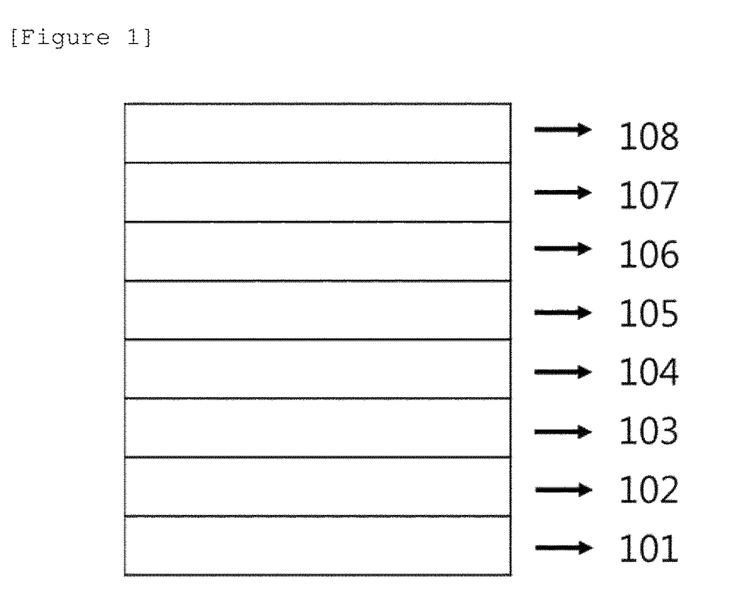
FIGS. 1 and 2 exemplify a structure of each of the organic-inorganic hybrid solar cells according to exemplary embodiments of the present specification.

In the present specification, in the organic-inorganic hybrid solar cell, a substrate, a first electrode, an electron transporting layer, a first light absorbing layer, a second light absorbing layer, a third light absorbing layer, a hole transporting layer, and a second electrode may be sequentially provided. FIG. 1 exemplifies a structure of an organic-inorganic hybrid solar cell according to an exemplary embodiment of the present specification. Specifically, FIG. 1 exemplifies a structure of an organic-inorganic hybrid solar cell, in which a first electrode 102 is provided on a substrate 101, an electron transporting layer 103 is provided on the first electrode 102, a first light absorbing layer 104 is provided on the electron transporting layer 103, a second light absorbing layer 105 is provided on the first light absorbing layer 104, a third light absorbing layer 106 is provided on the second light absorbing layer 105, a hole transporting layer 107 is provided on the third light absorbing layer 106, and a second electrode 108 is provided on the hole transporting layer 107. The organic-inorganic hybrid solar cell according to the present specification is not limited to the stacking structure in FIG. 1, and may further include an additional member.

Figure 2:
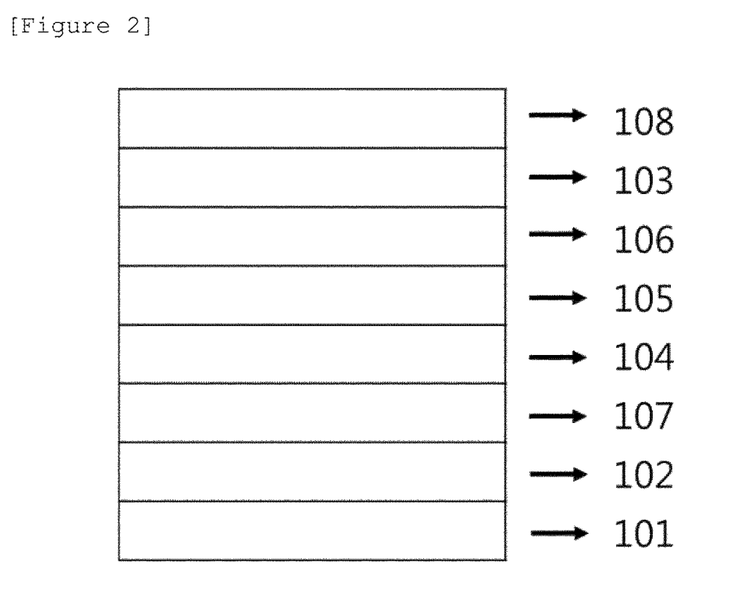
Figure 3:
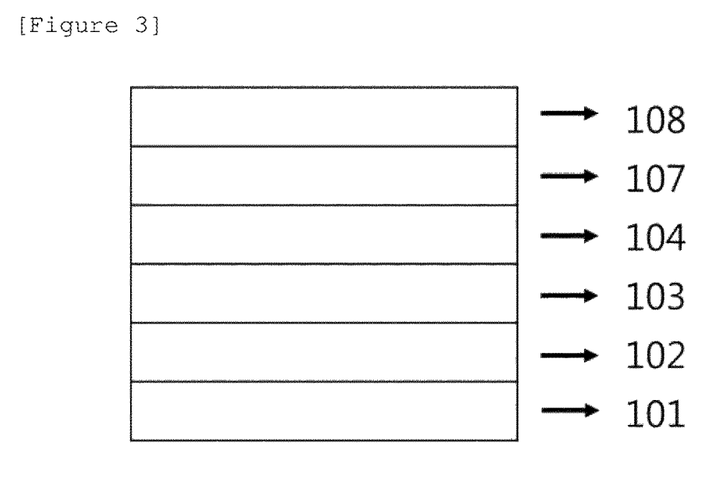
FIG. 3 exemplifies a structure of an organic-inorganic hybrid solar cell according to a Comparative Example of the present specification.

In the present specification, in the organic-inorganic hybrid solar cell, a substrate, a first electrode, a hole transporting layer, a first light absorbing layer, a second light absorbing layer, a third light absorbing layer, an electron transporting layer, and a second electrode may be sequentially provided. FIG. 2 exemplifies a structure of an organic-inorganic hybrid solar cell according to an exemplary embodiment of the present specification. Specifically, FIG. 2 exemplifies a structure of an organic-inorganic hybrid solar cell, in which a first electrode 102 is provided on a substrate 101, a hole transporting layer 107 is provided on the first electrode 102, a first light absorbing layer 104 is provided on the hole transporting layer 107, a second light absorbing layer 105 is provided on the first light absorbing layer 104, a third light absorbing layer 106 is provided on the second light absorbing layer 105, an electron transporting layer 103 is provided on the third light absorbing layer 106, and a second electrode 108 is provided on the electron transporting layer 103. The organic-inorganic hybrid solar cell according to the present specification is not limited to the stacking structure in FIG. 2, and may further include an additional member.

In the present specification, as the substrate, it is possible to use a substrate having excellent transparency, surface smoothness, handling easiness, and waterproofing property. Specifically, a glass substrate, a thin film glass substrate, or a plastic substrate may be used. The plastic substrate may include a film such as polyethylene terephthalate (PET), polyethylene naphthalate (PEN), polyether ether ketone, and polyimide in the form of a single layer or a multi-layer. However, the substrate is not limited thereto, and a substrate typically used for an organic-inorganic hybrid solar cell may be used.

In the present specification, the first electrode may be an anode, and the second electrode may be a cathode. Further, the first electrode may be a cathode, and the second electrode may be an anode.

In the present specification, the first electrode may be a transparent electrode, and the organic-inorganic hybrid solar cell may absorb light by way of the first electrode.

When the first electrode is a transparent electrode, the first electrode may be a conductive oxide such as indium-tin oxide (ITO), indium-zinc oxide (IZO), or fluorine-doped tin oxide (FTC)). Furthermore, the first electrode may be a semi-transparent electrode. When the first electrode is a semi-transparent electrode, the first electrode may be manufactured of a semi-transparent metal such as silver (Ag), gold (Au), magnesium (Mg), or an alloy thereof. When a semi-transparent metal is used as a first electrode, the organic-inorganic hybrid solar cell may have a micro cavity structure.

In the present specification, when the electrode is a transparent conductive oxide layer, as the electrode, it is possible to use an electrode in which a material having conductivity is doped on a flexible and transparent material such as plastic including polyethylene terephthalate (PET), polyethylene naphthalate (PEN), polypropylene (PP), polyimide (PI), polycarbonate (PC), polystyrene (PS), polyoxyethylene (POM), an AS resin (acrylonitrile styrene copolymer), an ABS resin (acrylonitrile butadiene styrene copolymer), triacetyl cellulose (TAC), polyarylate (PAR), and the like, in addition to glass and a quartz plate.

Specifically, the first electrode may be indium tin oxide (ITO), fluorine doped tin oxide (FTC)), aluminum doped zinc oxide (AZO), indium zinc oxide (IZO), ZnO—$Ga_2O_3$, ZnO—$Al_2O_3$ and antimony tin oxide (ATO), and the like, and more specifically, ITO.

In the present specification, the second electrode may be a metal electrode. Specifically, the metal electrode may include one or two or more selected from the group consisting of silver (Ag), aluminum (Al), platinum (Pt), tungsten (W), copper (Cu), molybdenum (Mo), gold (Au), nickel (Ni), palladium (Pd), magnesium (Mg), chromium (Cr), calcium (Ca), and samarium (Sm).

In the present specification, the organic-inorganic hybrid solar cell may have an n-i-p structure. When the organic-inorganic hybrid solar cell according to the present specification has an n-i-p structure, the second electrode may be a metal electrode. Specifically, when the organic-inorganic hybrid solar cell according to an exemplary embodiment of the present specification has an n-i-p structure, the second electrode may include gold (Au), silver (Ag), aluminum (Al), $MoO_3$/Au, $MoO_3$/Ag, $MoO_3$/Al, $V_2O_5$/Au, $V_2O_5$/Ag, $V_2O_5$/Al, $WO_3$/Au, $WO_3$/Ag, or $WO_3$/Al.

In the present specification, the n-i-p structure means a structure in which a first electrode, an electron transporting layer, a light absorbing layer, a hole transporting layer, and a second electrode are sequentially stacked.

In the present specification, the organic-inorganic hybrid solar cell may have a p-i-n structure. When the organic-inorganic hybrid solar cell according to the present specification has a p-i-n structure, the second electrode may be a metal electrode.

In the present specification, the p-i-n structure means a structure in which a first electrode, a hole transporting layer, a light absorbing layer, an electron transporting layer, and a second electrode are sequentially stacked.

In the present specification, the organic-inorganic hybrid solar cell may further include an additional layer provided between the first electrode and the second electrode. Specifically, according to an exemplary embodiment of the present specification, the additional layer may further include one or more selected from the group consisting of a hole injection layer, a hole transporting layer, an electron blocking layer, an electron transporting layer, and an electron injection layer.

In the present specification, a material for the hole transporting layer and/or the electron transporting layer may be a material which increases the probability that charges produced move to an electrode by efficiently transferring electrons and holes to a light absorbing layer, but is not particularly limited.

In the present specification, the electron transporting layer may include a metal oxide. As the metal oxide, it is possible to specifically use one or two or more selected from Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, In oxide, SrTi oxide, and a composite thereof, but the metal oxide is not limited thereto.

In the present specification, the electron transporting layer may improve characteristics of charges by using doping, and may modify a surface of the electron transporting layer by using a fluorene derivative, and the like.

In the present specification, the electron transporting layer may be formed by being applied onto one surface of a first electrode or coated in the form of a film by using a method such as sputtering, E-Beam, thermal deposition, spin coating, screen printing, inkjet printing, doctor blade, or gravure printing.

In the present specification, the hole transporting layer may be an anode buffer layer.

The hole transporting layer may be introduced into an upper portion of the third light absorbing layer by a method such as spin coating, dip coating, inkjet printing, gravure printing, spray coating, doctor blade, bar coating, gravure coating, brush painting, and thermal deposition.

The hole transporting layer may use tertiary butyl pyridine (tBP), lithium bis(trifluoro methanesulfonyl)imide (LiTFSI), poly(3,4-ethylenedioxythiophene):poly(4-styrenesulfonate) [PEDOT:PSS], and the like, but the material is not limited thereto.

Mode for Invention

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided to more completely explain the present specification to a person with ordinary skill in the art.

EXAMPLE 1

An organic substrate (40 Ω/sq) coated with indium tin oxide (ITO) was washed sequentially with acetone and isopropyl alcohol (IPA) for 1 hour, respectively, by using an ultrasonic cleaner. An ITO substrate coated with $TiO_2$ (hereinafter, referred to as an electron transporting layer) was manufactured by repeating three times a procedure of spin-coating a solution including titanium dioxide ($TiO_2$) on the ITO substrate, and heat treatment at 150° C. for 30 minutes.

A yellow solution formed by dissolving 1 mM of lead iodide ($PbI_2$) (purity 99%, Sigma Aldrich Co., Ltd.) in 1 ml of dimethylformamide (DMF) was spin-coated on the electron transporting layer. Thereafter, a first light absorbing layer was formed by spin-coating a solution formed by dissolving 10 mg of $CH_3NH_3I$ (MAI) in 1 ml of isopropyl alcohol thereon, and performing a heat treatment at 100° C. for 10 minutes.

Thereafter, a second light absorbing layer was formed by spin-coating 200 µl of a solution, which was formed by subdividing 40 mg of $(HC(NH_2)_2)I$, and then dissolving $(HC(NH_2)_2)I$ in 1 ml of isopropyl alcohol, on the upper portion of the first light absorbing layer, and performing a heat treatment at 100° C. for 30 minutes.

A yellow solution formed by dissolving 1 mM of lead iodide ($PbI_2$) (purity 99%, Sigma Aldrich Co., Ltd.) in 1 ml of dimethylformamide was spin-coated on the second light absorbing layer. Thereafter, a third light absorbing layer was formed by spin-coating a solution formed by dissolving 10 mg of $CH_3NH_3I$ (MAI) in 1 ml of isopropyl alcohol thereon, and performing a heat treatment at 100° C. for 30 minutes.

A hole transporting layer was formed by spin-coating, on the third light absorbing layer, a solution obtained by mixing an acetonitrile solution, in which 80 mg of spiro-OMeTAD (2,2',7,7'-tetrakis(N,N-di-p-methoxyphenylamine)-9,9'-spirobifluorene), 28.5 µl of tert-butylpyridine (tBP), and 17.5 µl of LiTFSI were mixed, with 1 ml of chlorobenzene. At this time, LiTFSI was dissolved in acetonitrile at a concentration of 520 mg/mL, and then added in a solution state thereto.

Silver (Ag) was deposited to a thickness of 150 nm on the hole transporting layer under a pressure of $10^{-8}$ torr to form a second electrode, thereby completing an organic-inorganic hybrid solar cell.

EXAMPLE 2

An organic-inorganic hybrid solar cell was manufactured in the same manner as in Example 1, except that in order to form the second light absorbing layer, 200 µl of a solution formed by mixing $(HC(NH_2)_2)I$ and $CH_3NH_3I$ at a molar ratio of 0.7:0.3 and then dissolving the mixture in 1 ml of isopropyl alcohol was spin-coated on the upper portion of the first light absorbing layer.

COMPARATIVE EXAMPLE 1

An organic substrate (40 Ω/sq) coated with indium tin oxide (ITO) was washed sequentially with acetone and isopropyl alcohol (IPA) for 1 hour, respectively, by using an ultrasonic cleaner. An ITO substrate coated with $TiO_2$ (hereinafter, referred to as an electron transporting layer) was manufactured by repeating three times a procedure of spin-coating a solution including titanium dioxide ($TiO_2$) on the ITO substrate, and heat treatment at 150° C. for 30 minutes.

A yellow solution formed by dissolving 1 mM of lead iodide ($PbI_2$) (purity 99%, Sigma Aldrich Co., Ltd.) in 1 ml of dimethylformamide (DMF) was spin-coated on the electron transporting layer. Thereafter, a light absorbing layer was formed by spin-coating a solution formed by dissolving 40 mg of $CH_3NH_3I$ (MAI) in 1 ml of isopropyl alcohol thereon, and performing a heat treatment at 100° C. for 10 minutes.

A hole transporting layer was formed by spin-coating, on the light absorbing layer, a solution obtained by mixing an acetonitrile solution, in which 80 mg of spiro-OMeTAD (2,2',7,7'-tetrakis(N,N-di-p-methoxyphenylamine)-9,9'-spirobifluorene), 28.5 µl of tert-butylpyridine (tBP), and 17.5 µl of LiTFSI were mixed, with 1 ml of chlorobenzene. At this time, LiTFSI was dissolved in acetonitrile at a concentration of 520 mg/mL and then added in a solution state thereto.

Silver (Ag) was deposited to a thickness of 150 nm on the hole transporting layer under a pressure of $10^{-8}$ torr to form a second electrode, thereby completing an organic-inorganic hybrid solar cell.

COMPARATIVE EXAMPLE 2

An organic-inorganic hybrid solar cell was manufactured in the same manner as in Comparative Example 1, except that in order to form the light absorbing layer, a yellow solution formed by dissolving 1 mM of lead iodide ($PbI_2$) (purity 99%, Sigma Aldrich Co., Ltd.) in 1 ml of dimethylformamide (DMF) was spin-coated on the electron transporting layer, and then a solution formed by dissolving 72 mg of $(HC(NH_2)_2)I$ in 1 ml of isopropyl alcohol was spin-coated thereon.

Figure 4:
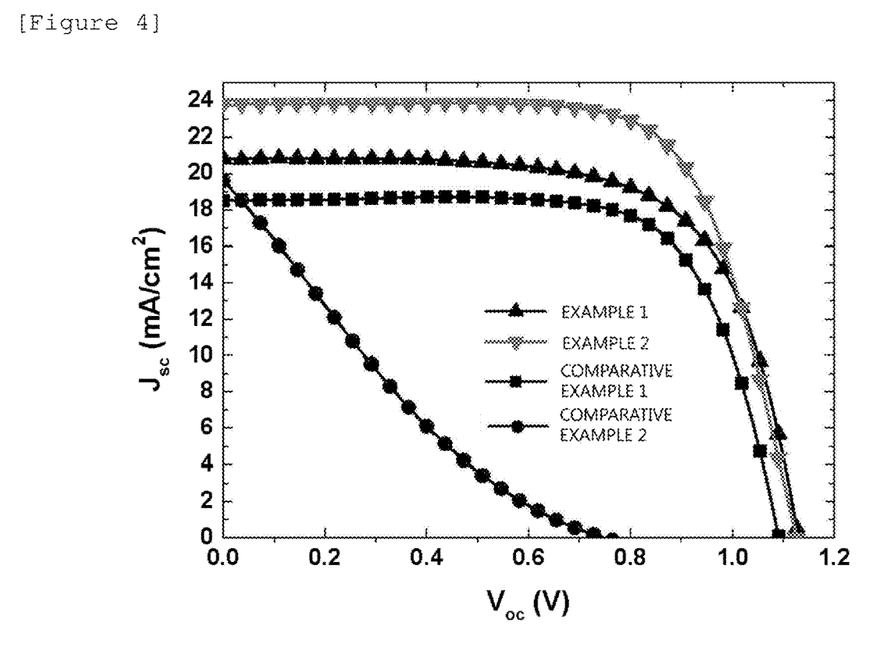
FIG. 4 illustrates a current density according to a voltage in each of the organic-inorganic hybrid solar cells manufactured in exemplary embodiments of the present specification.

Table 1 shows the performance of each of the organic-inorganic hybrid solar cells according to exemplary embodiments of the present specification, and FIG. 4 illustrates a current density according to a voltage in each of the organic-inorganic hybrid solar cells manufactured in exemplary embodiments of the present specification.

TABLE 1

|  | PCE (%) | $J_{sc}$ (mA/cm$^2$) | $V_{oc}$ (V) | FF (%) |
|---|---|---|---|---|
| Example 1 | 15.9 | 20.8 | 1.13 | 67.6 |
| Example 2 | 19.0 | 23.7 | 1.12 | 71.5 |
| Comparative Example 1 | 14.4 | 18.5 | 1.09 | 71.3 |
| Comparative Example 2 | 2.8 | 19.6 | 0.748 | 18.9 |

In Table 1, $V_{oc}$, $J_{sc}$, FF, and PCE mean an open-circuit voltage, a short-circuit current, a fill factor, and energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current and the open-circuit voltage. The energy conversion efficiency may be obtained when these three values are divided by the intensity of the irradiated light, and the higher value is preferred.

Figure 5:
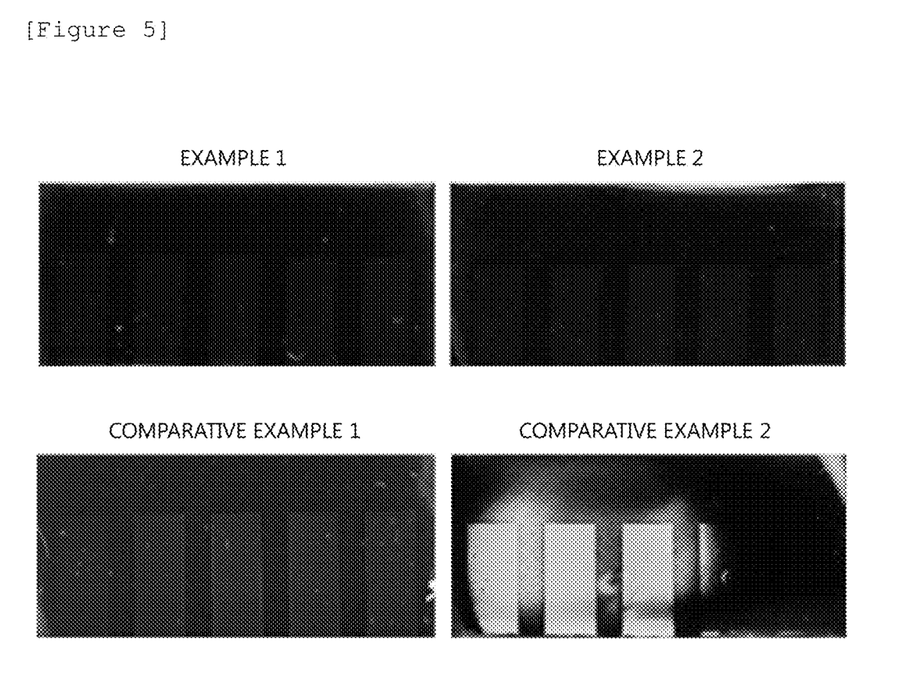
FIG. 5 illustrates a state of each of the organic-inorganic hybrid solar cells manufactured in exemplary embodiments of the present specification after 48 hours.

FIG. 5 illustrates a state after storing the organic-inorganic hybrid solar cells manufactured in exemplary embodiments of the present specification under nitrogen atmosphere for 48 hours. It can be confirmed that the organic-inorganic hybrid solar cells according to Examples 1 and 2 had no change even after time elapsed, whereas the organic-inorganic hybrid solar cells according to Comparative Examples 1 and 2 had a change in properties after 48 hours passed.

The invention claimed is:

1. An organic-inorganic hybrid solar cell comprising:
(a) a first electrode;
(b) an electron transporting layer or a hole transporting layer which is provided on the first electrode;
(c) a first light absorbing layer which includes a compound having a perovskite structure and is provided on (b) the electron transporting layer or the hole transporting layer;
(d) a second light absorbing layer which includes a compound having a perovskite structure and is provided on the first light absorbing layer;
(e) a third light absorbing layer which includes a compound having a perovskite structure and is provided on the second light absorbing layer;
(f) a hole transporting layer or an electron transporting layer which is provided on the third light absorbing layer; and
(g) a second electrode which is provided on (f) the hole transporting layer or the electron transporting layer,
wherein the first light absorbing layer is $C_nH_{2n+1}NH_3PbI_3$,
the second light absorbing layer is $HC(NH_2)_2PbI_3$,
the third light absorbing layer is $C_nH_{2n+1}NH_3PbI_3$, and
n is an integer from 1 to 9.

2. An organic-inorganic hybrid solar cell comprising:
(a) a first electrode;
(b) an electron transporting layer or a hole transporting layer which is provided on the first electrode;
(c) a first light absorbing layer which includes a compound having a perovskite structure and is provided on (b) the electron transporting layer or the hole transporting layer;
(d) a second light absorbing layer which includes a compound having a perovskite structure and is provided on the first light absorbing layer;
(e) a third light absorbing layer which includes a compound having a perovskite structure and is provided on the second light absorbing layer;
(f) a hole transporting layer or an electron transporting layer which is provided on the third light absorbing layer; and
(g) a second electrode which is provided on (f) the hole transporting layer or the electron transporting layer,
wherein the first light absorbing layer is $C_nH_{2n+1}NH_3PbI_3$,
the second light absorbing layer is $(C_nH_{2n+1}NH_3)_y(HC(NH_2)_2)_{(1-y)}PbI_3$,
the third light absorbing layer is $CH_3NH_3PbI_3$,
n is an integer from 1 to 9, and
$0 < y < 1$.

3. The organic-inorganic hybrid solar cell of claim 2, wherein the phase transition temperature of the first light absorbing layer is higher than the phase transition temperature of the second light absorbing layer.

4. The organic-inorganic hybrid solar cell of claim 2, wherein the phase transition temperature of the third light absorbing layer is higher than the phase transition temperature of the second light absorbing layer.

5. The organic-inorganic hybrid solar cell of claim 2, wherein the first light absorbing layer has a thickness of 1 nm to 100 nm.

6. The organic-inorganic hybrid solar cell of claim 2, wherein the second light absorbing layer has a thickness of 1 nm to 600 nm.

7. The organic-inorganic hybrid solar cell of claim 2, wherein the third light absorbing layer has a thickness of 1 nm to 100 nm.

8. The organic-inorganic hybrid solar cell of claim 1, wherein the phase transition temperature of the first light absorbing layer is higher than the phase transition temperature of the second light absorbing layer.

9. The organic-inorganic hybrid solar cell of claim 1, wherein the phase transition temperature of the third light absorbing layer is higher than the phase transition temperature of the second light absorbing layer.

10. The organic-inorganic hybrid solar cell of claim 1, wherein the first light absorbing layer has a thickness of 1 nm to 100 nm.

11. The organic-inorganic hybrid solar cell of claim 1, wherein the second light absorbing layer has a thickness of 1 nm to 600 nm.

12. The organic-inorganic hybrid solar cell of claim 1, wherein the third light absorbing layer has a thickness of 1 nm to 100 nm.

* * * * *